United States Patent
Nimni et al.

(10) Patent No.: US 9,236,504 B2
(45) Date of Patent: Jan. 12, 2016

(54) SYSTEM AND METHOD FOR CONTROLLING A GROUP OF PHOTOVOLTAIC GENERATORS

(75) Inventors: Yigal Nimni, Kiryat Yam (IL); Doron Shmilovitz, Tel Aviv (IL)

(73) Assignee: RAMOT AT TEL-AVIV UNIVERSITY LTD., Tel Aviv (IL)

(*) Notice: Subject to any disclaimer, the term of this patent is extended or adjusted under 35 U.S.C. 154(b) by 942 days.

(21) Appl. No.: 13/319,689

(22) PCT Filed: May 9, 2010

(86) PCT No.: PCT/IL2010/000371
§ 371 (c)(1),
(2), (4) Date: Apr. 22, 2012

(87) PCT Pub. No.: WO2010/131245
PCT Pub. Date: Nov. 18, 2010

(65) Prior Publication Data
US 2012/0193990 A1    Aug. 2, 2012

Related U.S. Application Data

(60) Provisional application No. 61/177,295, filed on May 12, 2009.

(51) Int. Cl.
H02J 1/00 (2006.01)
H01L 31/02 (2006.01)
G05F 1/67 (2006.01)
H02J 3/38 (2006.01)

(52) U.S. Cl.
CPC ............ *H01L 31/02021* (2013.01); *G05F 1/67* (2013.01); *H02J 3/385* (2013.01); *Y02E 10/58* (2013.01); *Y10T 307/718* (2015.04)

(58) Field of Classification Search
CPC ............ G06F 1/67; Y02E 10/58; H02J 3/385; H01L 31/02021
USPC ......................................................... 307/84
See application file for complete search history.

(56) References Cited

U.S. PATENT DOCUMENTS

| | | | |
|---|---|---|---|
| 2007/0181175 A1* | 8/2007 | Landis | 136/252 |
| 2008/0143188 A1* | 6/2008 | Adest et al. | 307/82 |
| 2008/0198523 A1* | 8/2008 | Schmidt et al. | 361/88 |

* cited by examiner

*Primary Examiner* — Jared Fureman
*Assistant Examiner* — Duc M Pham
(74) *Attorney, Agent, or Firm* — Reches Patents

(57) ABSTRACT

A method for controlling a group of photovoltaic energy generators, the method includes providing, to a junction that is coupled to a component of a first photovoltaic energy generator (PEG), power generated by at least a second PEG such as to increase the power that is generated from the group of photovoltaic energy generators (PEGs); wherein the group of PEGs comprises the first PEG and the second PEG.

31 Claims, 12 Drawing Sheets

1200

SYSTEM AND METHOD FOR CONTROLLING A GROUP OF PHOTOVOLTAIC GENERATORS

RELATED APPLICATIONS

This application claims the priority of U.S. provisional patent 61/177,295 filed May 12, 2009, which is incorporated herein by reference.

FIELD OF THE INVENTION

The present relates to methods and systems for controlling a group of photovoltaic generators.

BACKGROUND OF THE INVENTION

FIG. 1a illustrates a model of a single photovoltaic (PV) cell. The single PV cell can be modeled as a current source Isc 11 in parallel with a forward biased diode Dcell 14 along with a series and a shunt resistance Rs 18 and Rsh 16. A current/sc 11 is proportional to the solar irradiance received by the PV cell and it is also approximately equal to the short circuit current of the panel. A current Id 12 flows through Del 14 while a current I 22 flows through Rs 18.

Rsh 16 represents the slope of the I-V characteristics near short circuit and Rs 18 represents the slope of its I-V characteristics near an open circuit, as is illustrated by curves 24 and 26 of FIG. 1b. Curve 26 illustrates the I-V characteristics of a real PV cell while curve 24 illustrates the I-V characteristics of an ideal PV cell.

The diode determines the non-linear (exponential) course of the current curve. The PV cell output current can be represented as:

$$I = Isc - Io * \{\exp(vd/(n-vt))$$

Where Isc and Io relate to their respective current densities Jsc and Is as follows:

$$Isc = A * Jsc * \% \text{ irrad}$$

$$Io = A * Is.$$

Where:

Jsc is the PV cell short circuit density (ma/cm$^2$) at standard (AM 1.5 G, 1000 W/m$^2$, T=25° C.) conditions.

A is the cell area (cm$^2$).

Is is the cell diode reverse bias saturation current.

Vd is the voltage across the cell diode which is in good approximation to the cell voltage V.

n is the emission coefficient for the cell diode. It depends on the manufacturing process (e.g. between 1 and 2).

Vt is the cell diode thermal voltage, in some cells about 26 mv at 300K.

% irrad is the percentage of the sun irradiance in comparison to 1000 W/m$^2$ (100%).

Partial Shading Problems in PV Systems

PV systems can include many PV cells, some of which can be shaded or partially shaded during certain points in time. The shading reduces the overall power generated by a PV system due to the loss of available irradiation caused by shading and due to the so-called mismatch loss caused by partial shading.

Usually a PV system includes many PV cells. An output voltage of a PV cell is determined by its forward biased diode voltage (which can be about 0.55 v but varies depending on the PV cell technology). Because PV systems can be required to output an output voltage of few hundred volts a very large number of PV cells are sometimes connected in a serial manner to provide such an output voltage. For example, if the PV system generates energy that should be provided to a 220 v alternating current (AC) grid then the PV system should generate a direct current (DC) voltage of about 300V or more. This requires serially connecting a few hundred (e.g., about 600) PV cells to each other.

It is noted that PV cells can also be connected in parallel—in order to increase the current/power of the PV system.

Typically long PV cells are "split" to separate PV panels, each including at least one string of PV cells.

When serially connected, a PV cell that is partially or fully shaded reduces the current that flows through the entire string of PV cells—thus reducing the power that can be generated by other PV cells in the string. PV cells that do not generate any current (for example, if they are fully shaded) nullify the power output of the entire serially connected PV cell system.

One known solution to the problem of fully shaded PV cells includes bypass diodes—if a PV cell does not generate adequate power it is bypassed by a bypass diode that is connected in parallel to the PC cell.

FIG. 2 illustrates an equivalent circuit that represents an array of sixteen sequentially connected PV cells. Each PV cells is represented by a PV cell model of a diode (such as D1 22(1), D2 22(2)) that is connected in parallel to a current source (such as 21(1), 21(2)). The current generated by each PV cell is indicated in the figure. The first fourteen PV cells generate 1 A each, while two (fully shaded PV cells) generate 0 A each. These two fully shaded PV cells are represented by PV cell models 20(1) and 20(16) that are bypassed by bypass diode 24.

The model of FIG. 2 also illustrates a load 26 that is connected to the sequence of 16 PV cells and a current lload 28 that passes through the load.

Curve 32 of FIG. 3 illustrates current lload 28 and curve 40 of FIG. 3 illustrates the power (Pload) supplied to the load as a function of the voltage drop (Vload) on the load.

The maximal power is 7 w, assuming that lload 28 equals 1 A, the voltage the falls on each diode is 0.5 volt and each of the diodes are ideal. Fourteen non-shaded serially connected PV cells generate 14*0.4 volts*1 A=7 w.

FIG. 4 illustrates an equivalent circuit that represents an array of sixteen sequentially connected PV cells. Each PV cells is represented by a PV cell model of a diode (such as D1 22(1), D2 22(2)) that is connected in parallel to a current source (such as 21(1), 21(2)). The current generated by each PV cell is indicated in the figure.

The first four PV cells (represented by models 20(1)-20(4)) are partially shaded (30%) and generate 0.7 A each, the last four PV cells (represented by models 20(13)—20(16)) are partially shaded (70%) and 0.3 A each, while other PV cells generate 1 A each.

The first four partially shaded PV cells are bypassed by bypass diode 24(1). The last four partially shaded PV cells are bypassed by bypass diode 24(2).

The model of FIG. 4 also illustrates load 26 that is connected to the sequence of 16 PV cells, a current lload 28 that passes through the load and a voltage Vload 27 developed on load 26.

Curve 54 of FIG. 5 illustrates the without any bypass the 70% shaded PV so cells force a current of 0.3 A through each PV cell. This low current allows a maximal power production of 2.4 W—as illustrated by peak 59 of curve 52.

Curve 53 illustrates lload 28 when neither one of the bypass diodes is connected (and lload=0.3 A), when only bypass diode 24(1) is connected (and lload=0.7 A) and when both bypass diodes are activated to bypass all diodes is (and lload=1 A).

Curve 51 illustrates the power that can be generated by the sequence of PV cells (a) when neither one of the bypass diodes is connected (and lload=0.3 A), (b) when only bypass diode 24(1) is connected (and lload=0.7 A) and (c) when both bypass diodes are activated to bypass all diodes (and lload=1 A).

Curve 51 of FIG. 5 illustrates the power (Pload) supplied to the load as a function of the voltage drop (Vload) 27 on the load. The maximal power production (a) when neither one of the bypass diodes is connected is 2.4 W (peak 59), (b) when only bypass diode 24(1) is connected is 2.4 W (peak 58), (c) when both bypass diodes are activated is 4 W (peak 57.

Curve 51 illustrates that there is a tradeoff between the number of bypassed PV cells and the current generated by each PV cell.

As illustrated above, the bypass prevents that PV cell from reducing the power provided by other serially connected PV cells. On the other hand, the power generated by the bypassed cell does not contribute to the total power generated by the serially connected PV cells.

Another disadvantage of bypassing PV cells is that the output power curve of the group of PV cells has several maximal power peaks (MPP). These peaks can cause mismatches between different PV panels that are connected to each other.

SUMMARY OF THE INVENTION

A method for controlling a group of photovoltaic energy generators, may include providing, to a junction that is coupled to a component of a first photovoltaic energy generator (PEG), power generated by at least a second PEG such as to increase the power generated from the group of PEGs; wherein the group of PEGs comprises the first PEG and the second PEG. The junction can be a part of the first PEG but it can be located outside the first PEG. The component can be a photovoltaic cell, an electrical component or any other component of the first PEG.

A method for controlling a group of photovoltaic energy generators, may include providing, to a junction that is coupled to a components of a first photovoltaic energy generator (PEG), power generated by at least a second PEG such as to alter a working point of the group of PEGs; wherein the group of PEGs comprises the first PEG and the second PEG.

A method for generating power by a group of photovoltaic energy generators may include providing, to a junction that is coupled to a component of a first photovoltaic energy generator (PEG), power generated by at least a second PEG such as to increase the power generated from the group of PEGs; wherein the group of PEGs comprises the first PEG and the second PEG.

A method for controlling a group of photovoltaic energy generators, the method comprises receiving current and voltage from at least a second photovoltaic energy generator (PEG); determining at least one conversion parameter; performing a voltage, and current conversion in response to the at least one conversion parameter to provide a converted current and a converted voltage to a first PEG so that the first PEG contributes to a power production of a group of PEGs and wherein the power generated by the group of PEGs is greater than a power produced by the group of PEGs if the first PEG is bypassed or isolated from other PEGs of the group of PEGs; wherein the group of PEGs comprises the first PEG and the second PEG.

A system for controlling a group of photovoltaic energy generators, the system comprises a power feedback circuit configured to provide, to a junction that is coupled to a component of a first PEG, power generated by at least a second PEG such as to increase the power generated from the group of PEGs; wherein the group of PEGs comprises the first PEG and the second PEG.

A system for controlling a group of photovoltaic energy generators, the system comprises a power feedback circuit that provides, to a junction that is coupled to a component of a first PEG, power generated by at least a second PEG such as to alter a working point of the group of PEGs; wherein the group of PEGs comprises the first PEG and the second PEG.

A system for generating power by a group of photovoltaic energy generators, the system comprises a power feedback circuit that provides, to a junction that is coupled to a component of a first photovoltaic energy generator (PEG), power generated by at least a second PEG such as to increase the power generated from the group of PEGs; wherein the group of PEGs comprises the first PEG and the second PEG.

A system for controlling a group of photovoltaic energy generators, the system comprises a sensor that receives current and voltage from at least a second PEG; a controller that determines at least one conversion parameter; a power feedback circuit that performs a voltage and current conversion in response to the at least one conversion parameter to provide a converted current and a converted voltage to a first PEG so that the first PEG contributes to a power production of a group of PEGs and wherein the power generated by the group of PEGs is greater than a power produced by the group of PEGs if the first PEG is bypassed or isolated from other PEGs of the group of PEGs; wherein the group of PEGs comprises the first PEG and the second PEG.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

A method for controlling a group of photovoltaic energy generators is provided. The method includes providing, to a conducting element that is connected to a first PEG, power generated by at least a second PEG such as to alter a working point of the group of PEGs. The group of PEGs includes the first PEG and the second PEG.

A method for generating energy by a group of photovoltaic energy generators, the method includes providing, to a conducting element that is connected to a first PEG, power generated by at least a second PEG such as to increase the power generated from the group of PEGs.

A method for controlling a group of photovoltaic energy generators, the method includes receiving current and voltage from at least a second PEG; determining at least one conversion parameter; performing a voltage and current conversion in response to the at least one conversion parameter to provide a converted current and a converted voltage to a first PEG so that the first PEG contributes to a power production of a group of PEGs and wherein the power generated by the group of PEGs is greater than a power produced by the group of PEGs, if the first PEG is bypassed or isolated from other PEGs of the group of PEGs.

Each of these methods can include a stage of determining whether to provide such power—and if so—and value of power to be provided. The power can be provided by for example supplying current, setting a voltage level, and the like.

Since energy requirements for solar systems needs long PV cells chains, all PV cells should be regulated to the same current. Since shaded PV cells are partially blocked in terms of current, the "missing" current (due to shading) or at least a part thereof can be provided by energy feedback circuits such as but not limited to a shunted current source. The compensation can be based on the energy generated by the PV cells chain.

Accordingly, a main grid of a PV cell chain may be used to supply feedback to partially shaded (or otherwise malfunctioning) PV cells.

The energy feedback circuit may return feedback current to a PV cell that generated a lower than desired current in a manner than increases the overall power generated by the PV cell chain.

The shunted current sources may be implemented as Energy Returned Current Converter (ERCC) units.

The ERCC units may be controlled dynamically (for example—in real time) by a controller such as a Central Processing Unit (CPU) that scans all the solar array rows every time constant (or in view of a triggering event such as reduction of generated power below a certain threshold) and tunes the ERCCs for achieving an optimal output power at the PV system main grids.

Figure 1A:
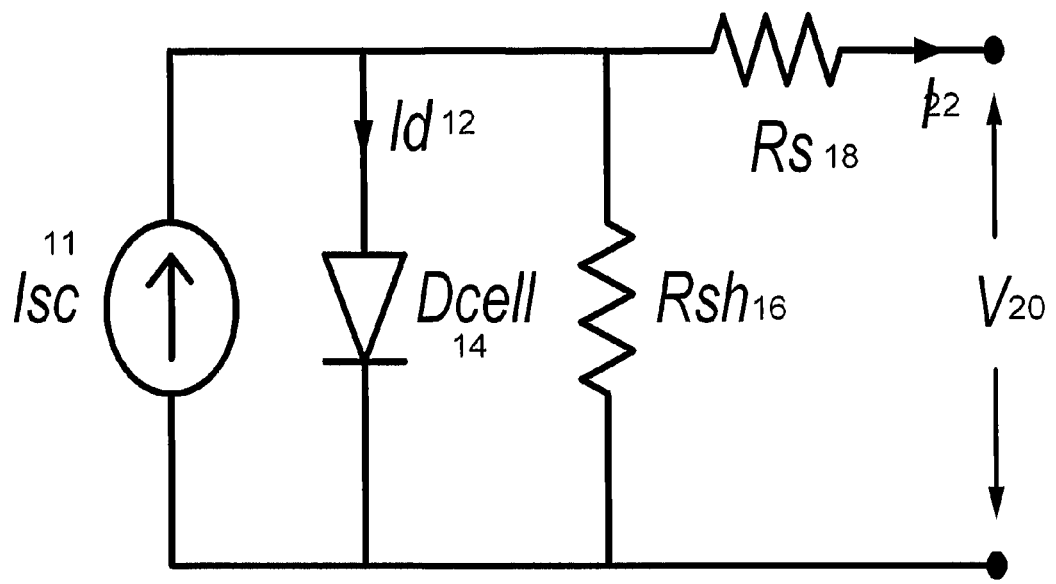
FIG. 1a illustrates a model of a single photovoltaic (PV) cell.
Figure 1B:
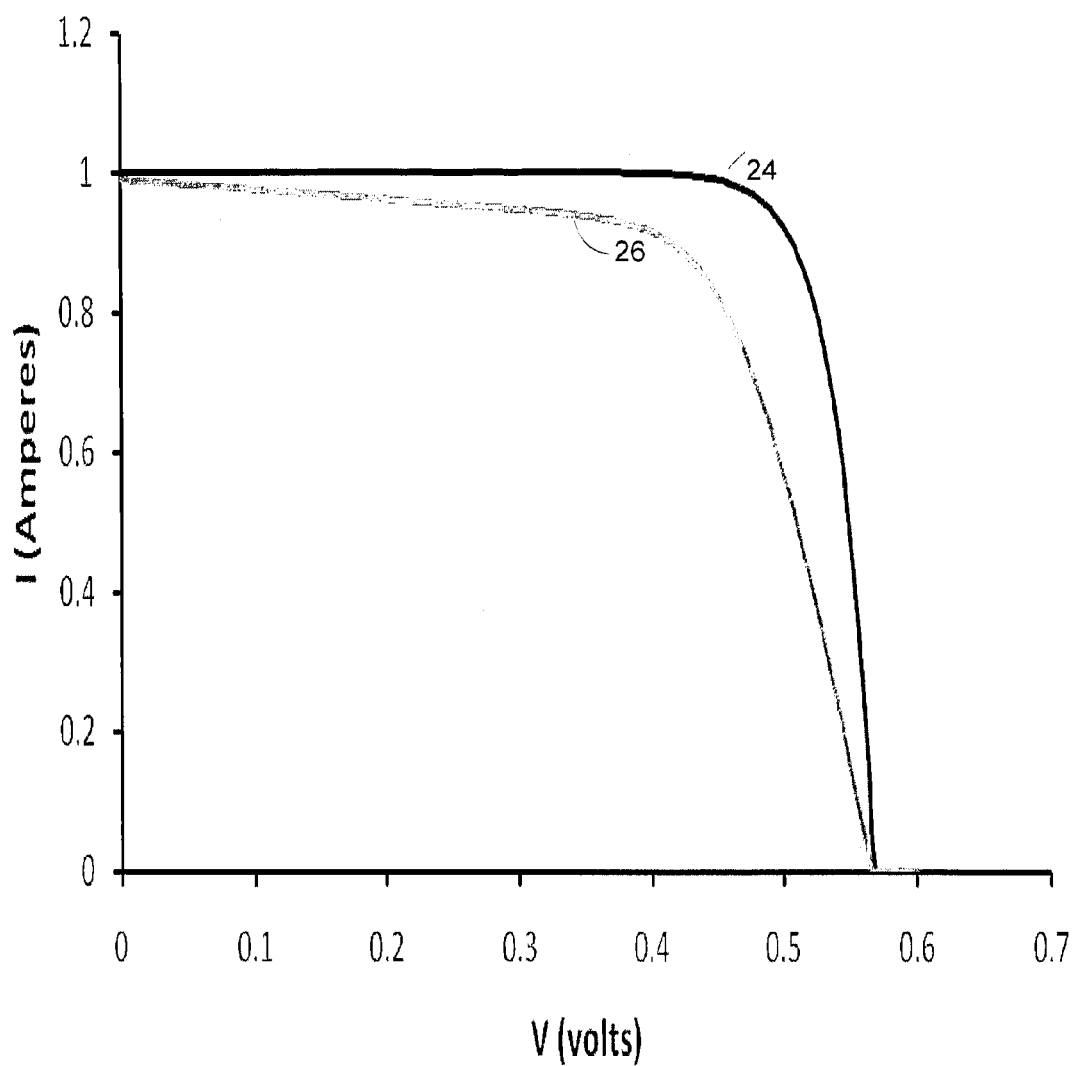
FIG. 1b illustrates various voltage versus current curves of PV cells.
Figure 2:
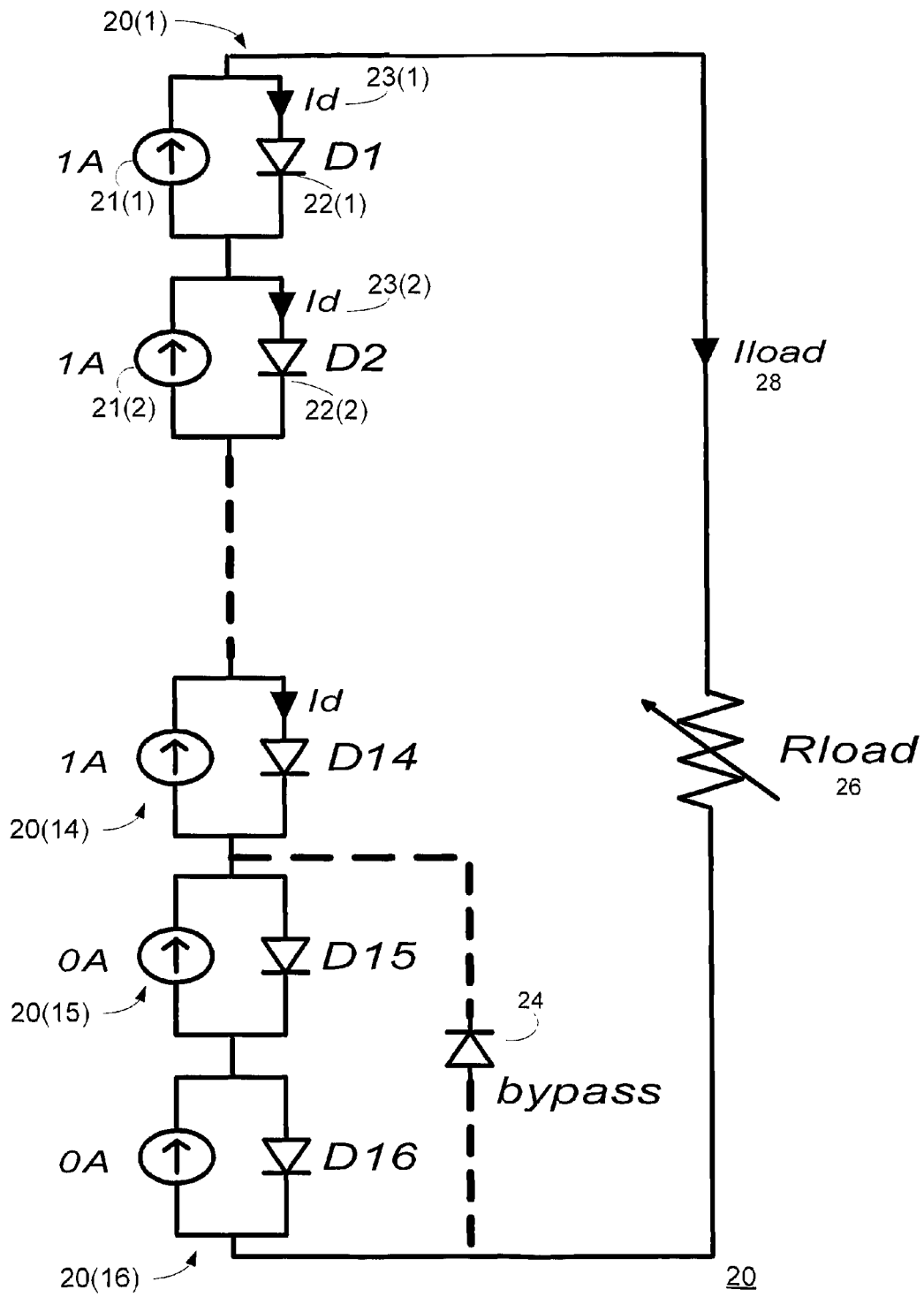
FIG. 2 illustrates an equivalent circuit that represents an array of sixteen sequentially connected PV cells.
Figure 3:
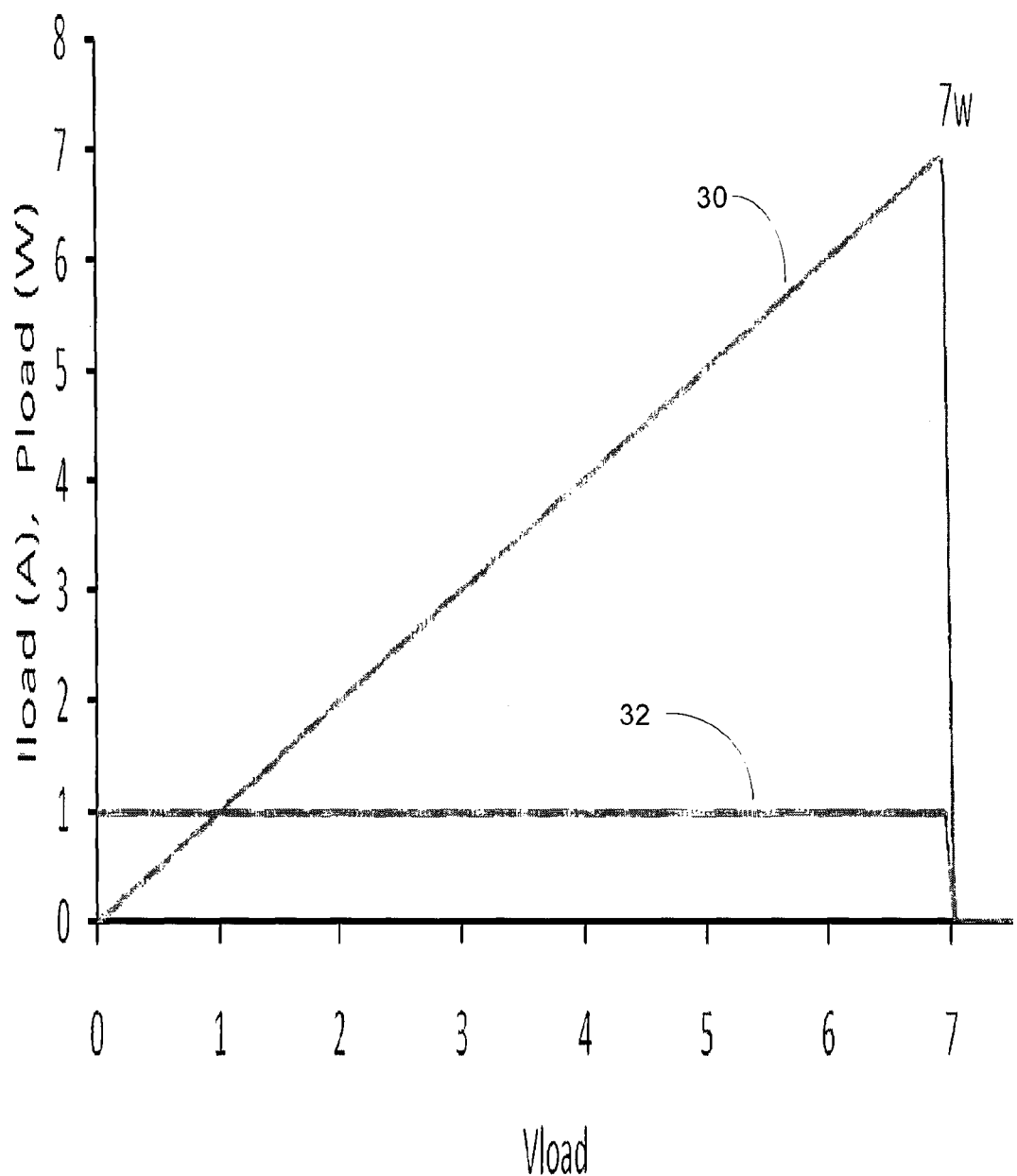
FIG. 3 illustrates various voltage versus current curves of PV cells of the array of FIG. 2.
Figure 4:
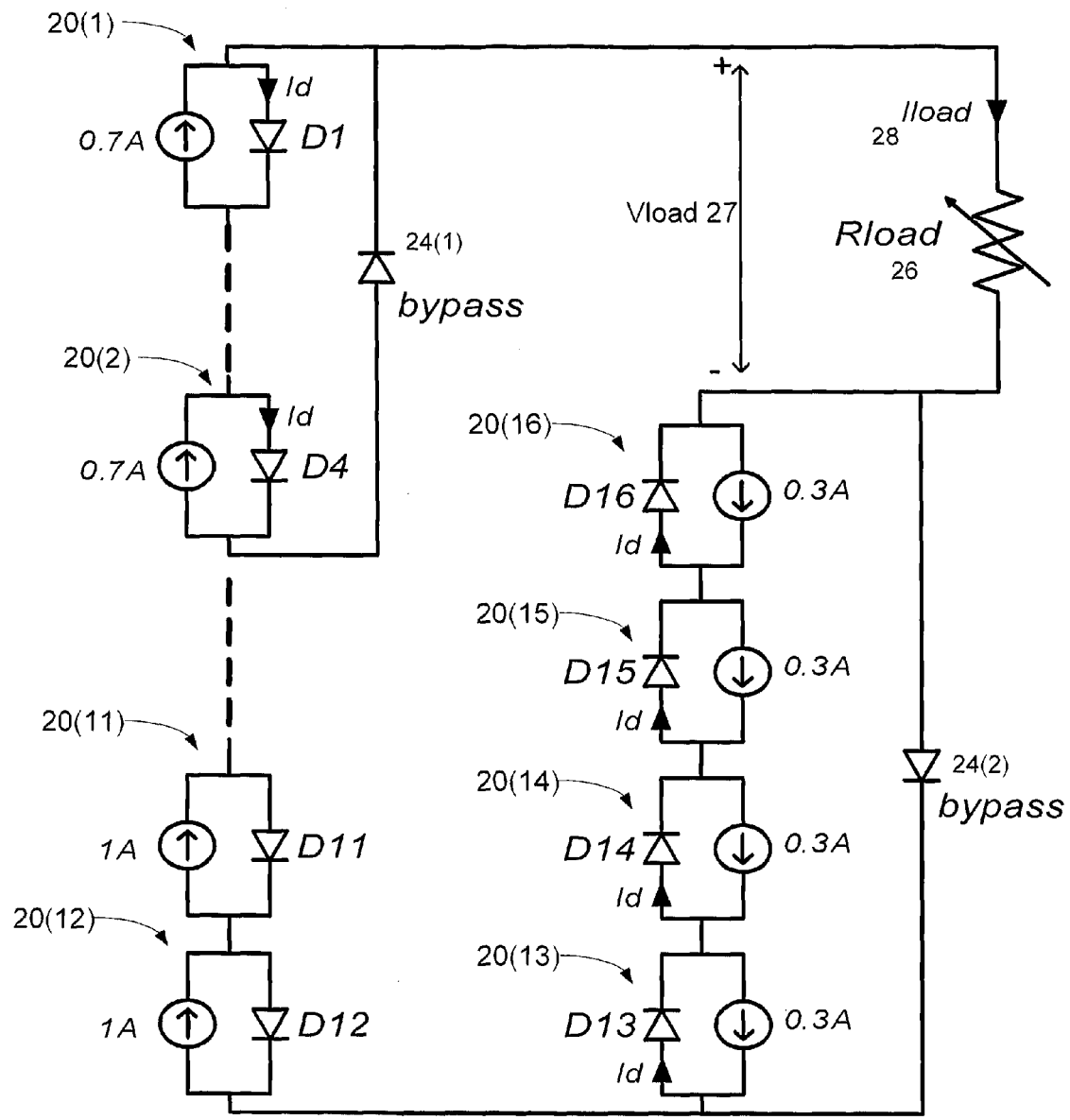
FIG. 4 illustrates an equivalent circuit that represents an array of sixteen sequentially connected PV cells.
Figure 5:
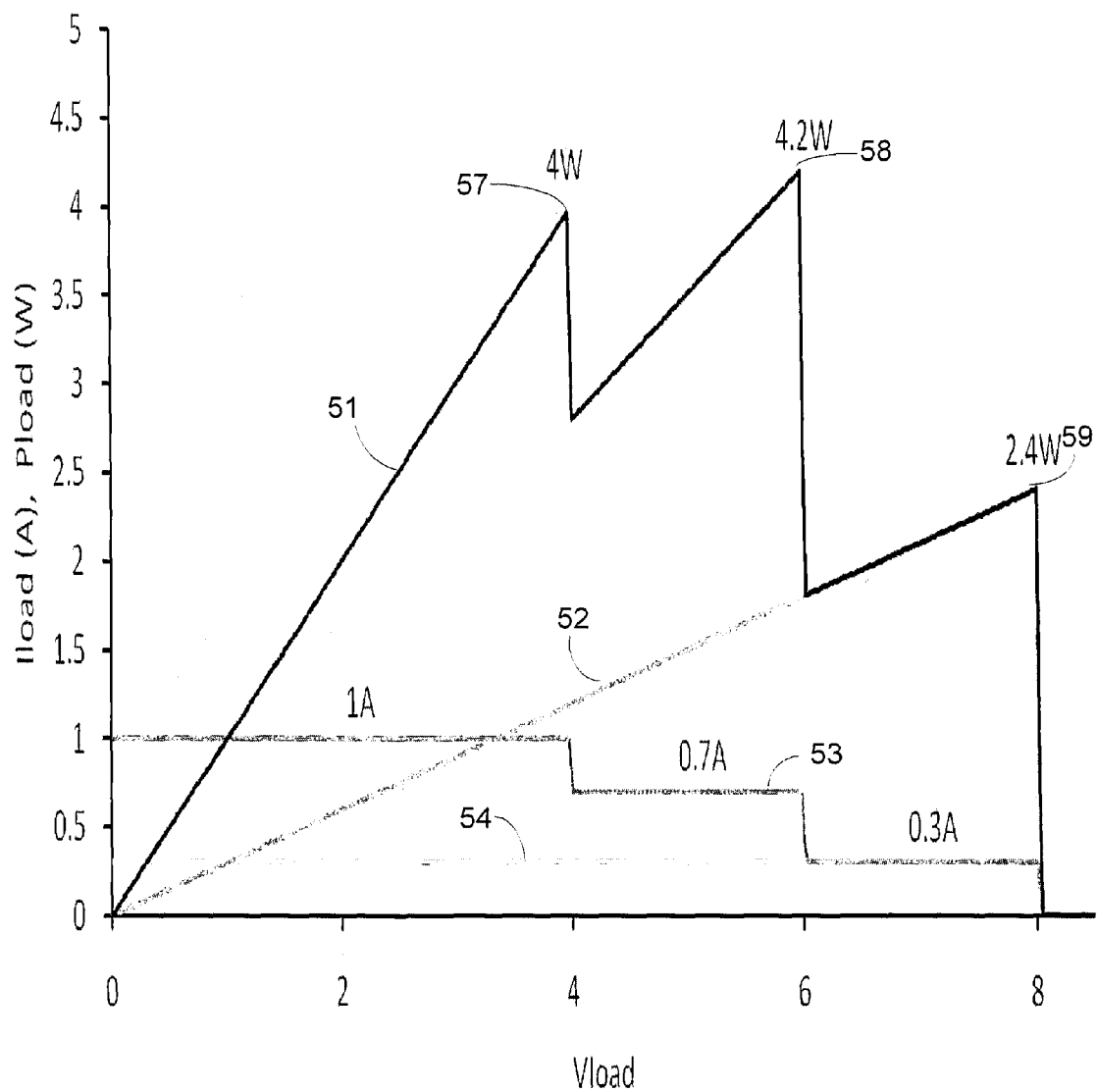
FIG. 5 illustrates an effect of bypassing PV cells.
Figure 6:
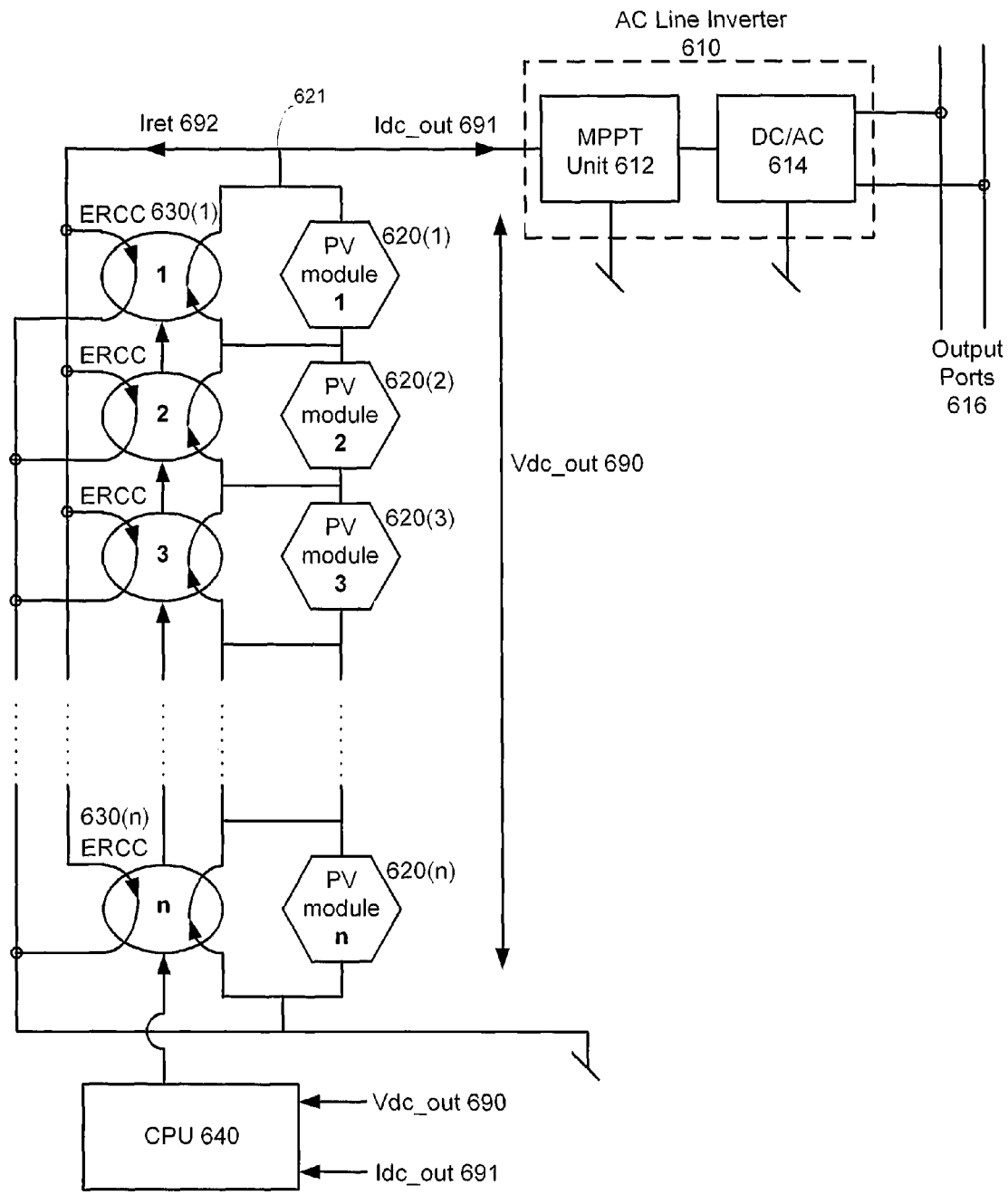
FIG. 6 illustrates a system according to an embodiment of the invention.

FIG. 6 illustrates system according to an embodiment of the invention. It illustrates a sequence of n PV modules 620(1)-620(n) that are serially connected to each other between the ground and a PV module sequence output node 621 to output a direct current (DC) voltage of Vds_out 690. Each PV module may include one or more PV cells. Each PV module is connected in parallel to an ERCC out of ERCCs 630(1)-630(n).

The sequence of PV modules also outputs current, some of which (Idc_out 691) is sent via Alternating current AC line converter 610 to output ports 616 of the system and some of which (feedback current fret 692) is provided as feedback to ERCC(1)-ERCC(n) 630(1)-630(n).

The ratio between fret 692 and Idc_out 691 is controlled by CPU 640. CPU 640 is connected to each ERCC and controls the amount of current outputted to each PV module. It can, additionally or alternatively, determine the voltage provided to each PV module.

It is noted that a single ERCC can be allocated per one or more PV cells, per one or more PV modules and the like.

Figure 7:
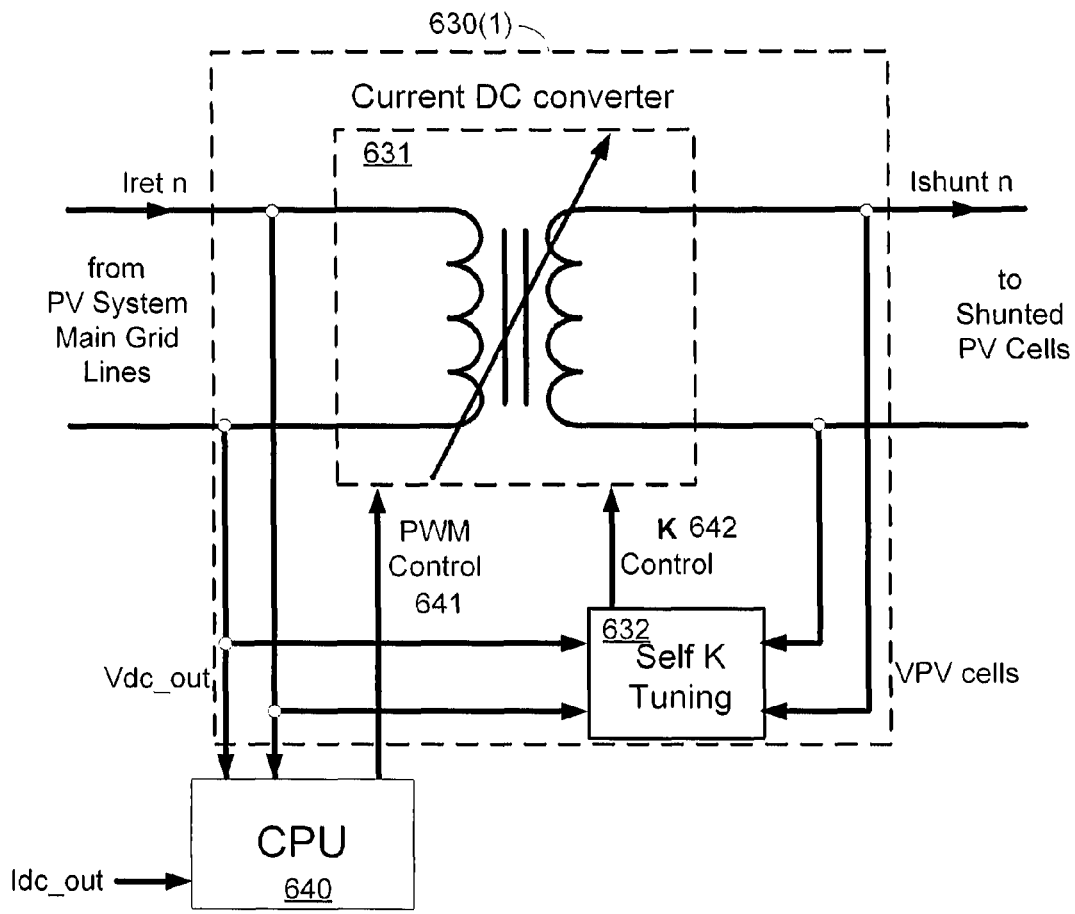
FIG. 7 illustrates an ERCC according to an embodiment of the invention.

FIG. 7 illustrates ERCC 610(1) and CPU 640 according to an embodiment of the invention.

ERCC 610(1) includes a current DC converter 631 that may be a variable transformer that has a controllable transform ratio. The transform ratio can be determined by a self K tuning circuit 632 (by sending a K control signal 642) and by a Pulse Width Modulation (PWM) signal 641 generated by CPU 640. K control signal 642 can be responsive to the number of serially connected PV modules and can be fixed during the operation of the ERCC. The PWM signal 641 may be responsive to the desired current to be supplied to the PV module.

Figure 8:
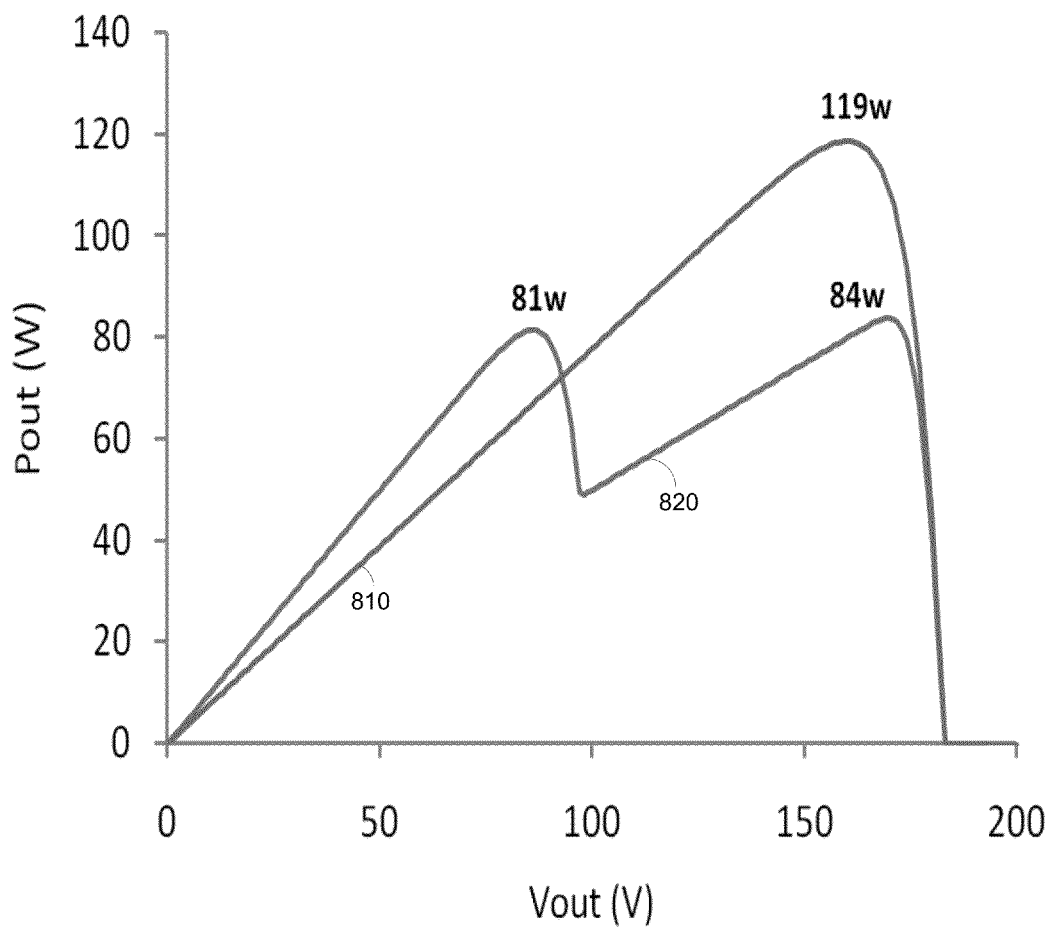
FIGS. 8 and 9 illustrates the relationship between voltage and either current or power of a bypassed system versus a ERCC equipped system according to an embodiment of the invention.
Figure 9:
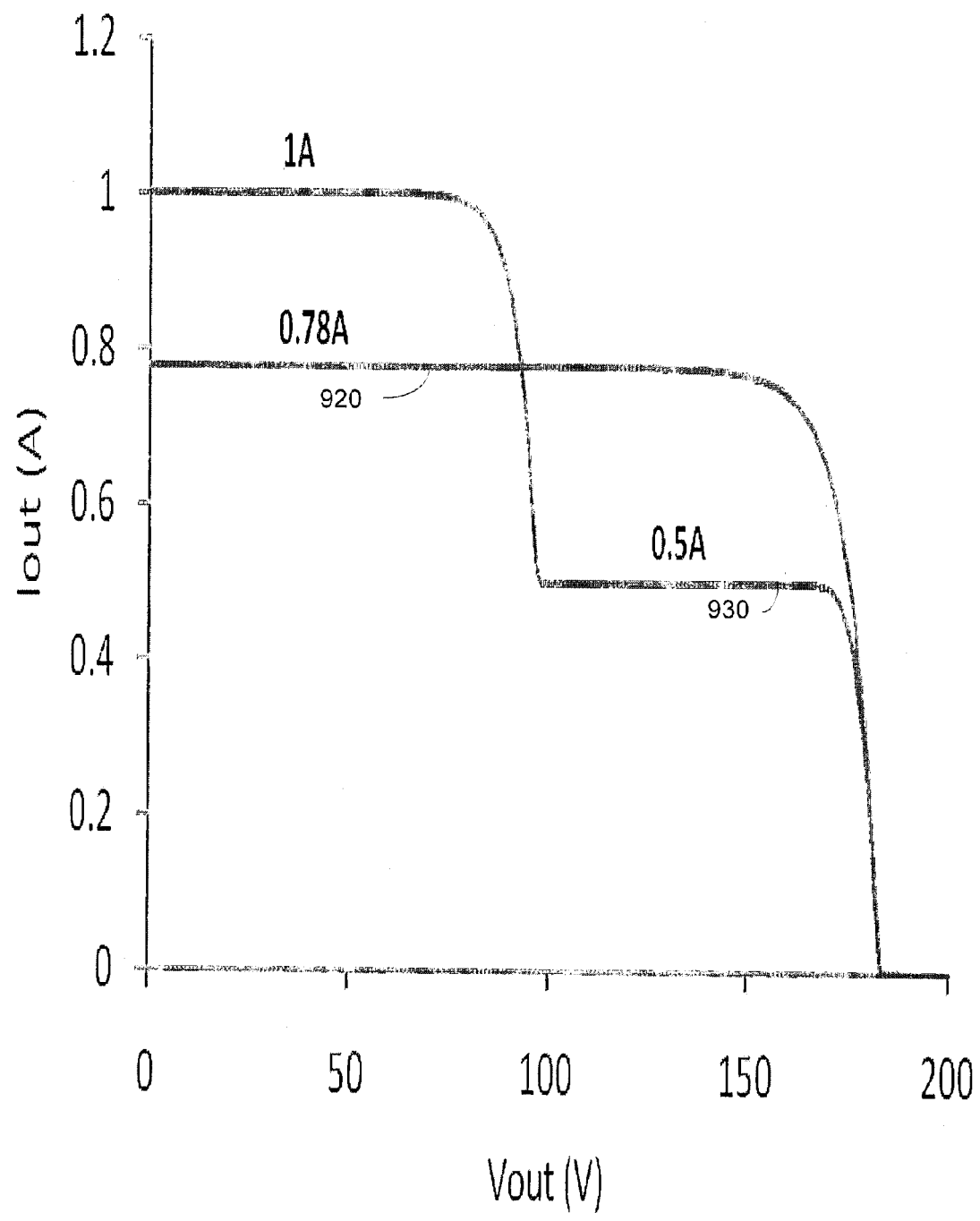

FIGS. 8 and 9 illustrate the results of simulation of a model. The model includes a sequence of nine PV cells. Five PV cells were not shaded at all (shaded area per each is 0% and the amount of shading is 0% -"0% A_0% S"). They outputted 20 v and 1 Ampere per PV cell. Four PV cells were partially shaded—50% of their area was shaded by a factor of 50% "50% A_50% S".

Four ERCC units (UD_ERCC) are shunting the shaded PV panels. A sweep voltage source (UniDir) is connected to the grid for evaluating DC sweep from 0 to 180V (for generating the system I_V curve). In order to evaluate the efficiency of the ERCCs versus diode bypass each shaded PV cell was also connected to a bypass diode. Control registers Rp1-Rp4, each connected in series to an input of a corresponding ERCC were used for enabling/disabling the ERCCs. Resistors Rs1-Rs4 (each connected to an output of an ERCC) were used for current measurements.

Curve 820 of FIG. 8 illustrates the dual peak curve of the model when bypass diode are used while single peak curve 810 illustrates the relationship between the output power Pout and output voltage Vout of the model. Being able to mobilize the locked potential energy of the shaded PV cells toward the load, gives in this example around of 42% gain in output power.

FIG. 9 illustrates a single peak output current versus output voltage curve 920 in the case that ERCCs are used and a multi peak output current versus output voltage curve 910 in the case that bypass diodes are used.

The absence of multiple peaks in the power and current curves provide a better quality and lower mismatch circuit. This may be very beneficial when joining PV power sources together in aspect of tuning Maximum Power Point (MPP) of the entire PV system.

Figure 10:
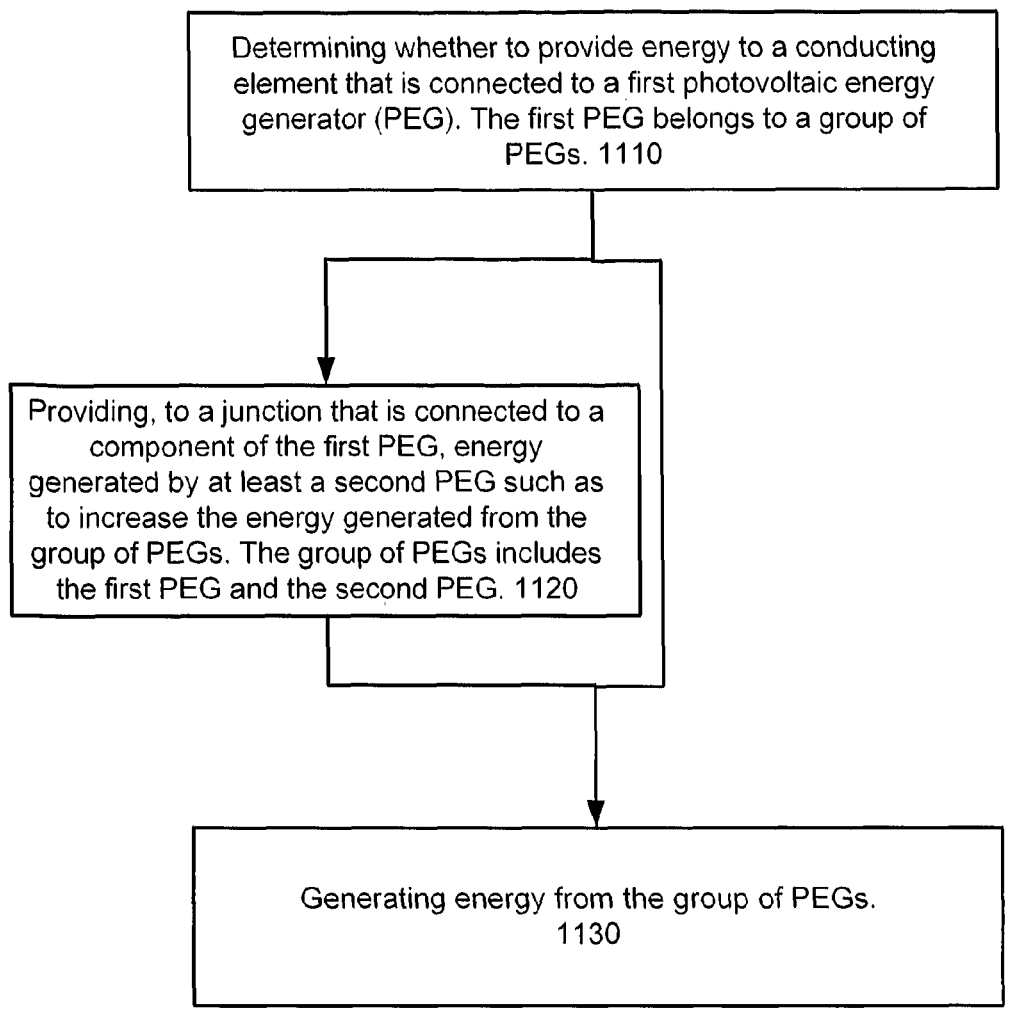
FIG. 10 illustrates a method according to an embodiment of the invention.

FIG. 10 illustrates method 1100 according to an embodiment of the invention.

In method 1100 in stage 1110 it is determined whether to provide power to a junction that is connected to a component of the first PEG. The PEG can include one or more PV cells, can be a PV panel, and the like. The first PEG may belong to a group of PEGs.

Stage 1110 can be responsive to power consideration such as the power gain (or loss) from providing power to the PEG, the power gain (or loss) from not providing the power, whether the PEG should be bypassed, and the like.

Stage 1110 can include (or be preceded by) either one of the following: (i) sensing power generated by each PEG, by the entire group of PEGs of by only one or more PEG of the group of PEGs, (ii) determining that a certain PEG (referred to as a first PEG) generates less power than other PEGs, (iii) determining that the first PEG has a negative effect on the overall power generated by group of PEGs (for example—its current reduces the current of other PEGs of the group), (iv) estimating that the first PEG has such a negative effect based upon expected shading effects, (v) comparing between a state in which power is provided to the PEG and a stage in which power is not provided to the PEG, and the like.

The determination can be done in various manners such as in a periodic manner, in a random manner, in a pseudo random manner, in response to an event (for example—power fall) or a combination thereof.

The determination can be a part of an iterative process in which different power values are returned to one or more PEGs and the overall power of the group of PEGs is evaluated, until the best setting is found. The best setting may be is generating a maximal amount of power, but this may differ in other embodiments. For example, a certain power level (and/or current value or voltage value) can be obtained in order to match one group of PEGs to another.

If the answer is positive (there is a need to provide power) then stage 1110 is followed by stage 1120 of providing, to a junction that is connected to a component of the first PEG, power generated by at least a second PEG such as to increase the power generated from the group of PEGs. The group of PEGs includes at least the first PEG and the second PEG.

Stage 1120 can include providing power generated from the entire group of PEGs, from one other PEG of from a sub-group of PEGs that include multiple PEGs. The power can be provided from one or more PEGs that generate relatively a high level or power in relation to other PEGs of the group (for example, fully illuminated PEGs, larger or otherwise inherently stronger PEGs and the like).

The provision can at least partially compensate for voltage or current differences between one PEG to another. For example if a first PEG generates a current of X/2 Amperes and a second PEG (serially connected to the first PEG) generates a current of X Amperes then the provision of power can include providing a current of X/2 to the first PEG (or slightly less than X/2 amperes) or to a conductor connected to the first PEG so that the second PEG will not be forced to output only X/2 Amperes.

Stage 1120 can include providing of power to determine a working point of the first PEG—the working point can be the current and voltage outputted by the first PEG can be determined by the provision of power.

If the answer is negative (no need to provide power) then stage 1110 is followed by stage 1130 of generating power from the group of PEGs. Stage 1120 is followed by stage 1130. Stage 1130 can be executed in parallel to stage 1110 and 1120 as the group of PVs can generate power during the determination and the provision of power.

It is noted that method 1110 can also include a stage (not shown) of bypassing one or more PEGs of the group. The bypassing can occur if it is more energy effective than providing power—for example—if a PV cell is fully shaded. Thus method 1100 can also include a stage of determining if one or more PV cells can be bypassed.

If stage 1120 is executed then stage 1130 includes utilizing power generated by the first PEG. Thus, the overall power generated by the group of PEGs can be increased.

Method 1100 can involve finding the best way (or a better way) to operate the group of PEGs—in terms of whether to provide power or not—and if so—how much power to provide. This can involve applying an iterative process that can include, for example: (i) providing a power of a first value to the first PEG; (ii) measuring the power generated by the group of PEGs to provide a first measurement result; (iii) providing a power of a second value to the first PEG; (iv) measuring the power generated by the group of PEGs to provide a second measurement result; and (v) determining a value of power to be provided to the first PEG in response to a comparison between the first and second measurement results. It is noted that more than two measurements can be made.

If power is provided to multiple PEGs then the iteration process can include changing the value of power provided to one PEG and then to another PEG in order to find an optimal setting of the group of PEGs.

Stage 1120 can include performing a direct current (DC) to DC conversion to provide to the first PEG a first current and a first voltage. The input can be provided from one or more PEGs of the group of PEGs. The DC to DC conversion can be responsive to a number of PEGs in the group of PEGs and to a desired power correction parameter. If, for example the power is provided from a sequence of K PEGs than the DC to DC conversion ratio should be about K, while the current should be responsive to the amount of "missing" current.

Method 1100 can include at least one of the following: (i) providing power to a junction that is connected to a component of a first PEG that generates less current then another PEG that is serially coupled to the first PEG and belongs to the group of PEGs, (ii) determining a value of power to be provided to the first PEG in response to an expected illumination condition change, (iii) selecting the first and second PEGs in response to an illumination condition, (iv) providing, to a junction that is coupled to a component of a third PEG, power generated by at least a fourth PEG such as to increase the power generated from the group of PEGs; wherein the group of PEGs comprises the third PEG and the fourth PEG.

Figure 11:
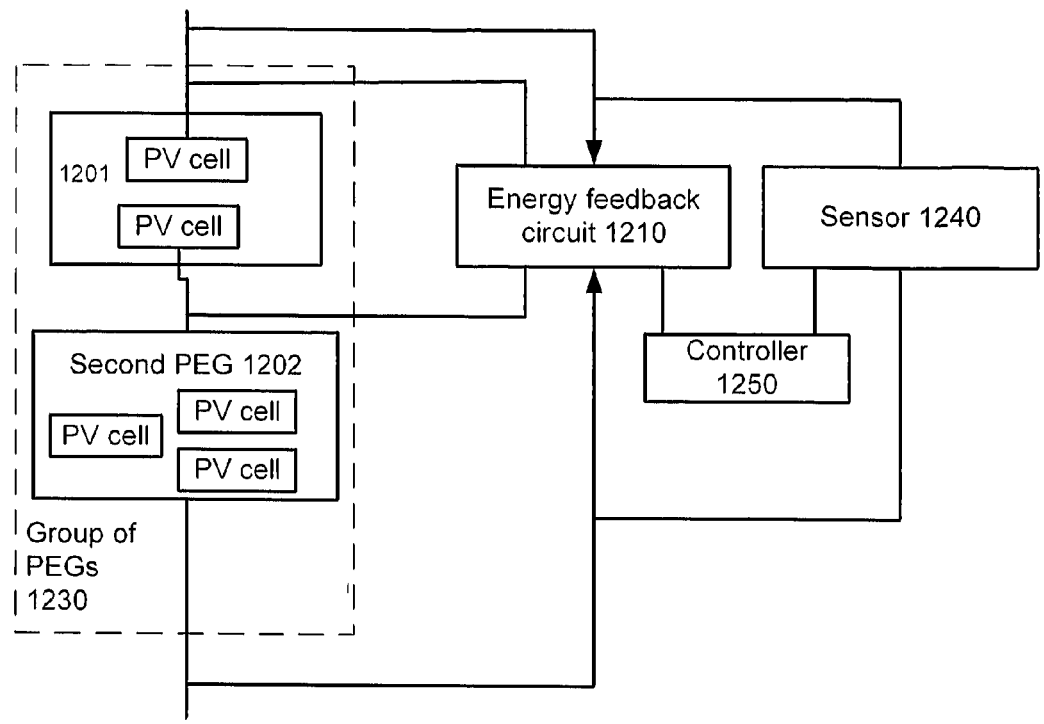
FIG. 11 illustrates a system according to an embodiment of the invention.

FIG. 11 illustrates system 1200 according to an embodiment of the invention.

System 1200 may include power feedback circuit 1210 that is configured to provide, to a junction that is coupled to a component of a first PEG 1201, power generated by at least a second PEG (202) such as to increase the power generated from the group of photovoltaic energy generators (PEGs) 1230. The group of PEGs 1230 includes first PEG 1201, second PEG 1202 and can include many other PEGs. FIG. 11 illustrates power feedback circuit 1210 as receiving power generated by the entire group of PEGs but this is not necessarily so.

System 1200 can also include sensor 1240 that is configured to sense power, current or voltage generated by the group of PEGs.

System 1200 can also include controller 1250 that is adapted to determine whether to provide the power in response to power considerations. Controller 1250 can o include a memory storing instructions that may perform parts or all of the methods described herein.

System 1200 can execute method 100 or any combination of one or more stages of method 100.

According to an embodiment of the invention system 200 can provide feedback power to multiple PEGs at once. This is not illustrated in FIG. 11.

A power feedback circuit that is termed Energy Returned Current Converter (ERCC), provides an example of a PEG that is a PV module. System 200 is illustrated as being connected (via AC line converter) to a 220V AC grid.

It will be appreciated that the present invention is not limited by what has been described hereinabove and that numerous modifications, all of which fall within the scope of the present invention, exist.

It will be appreciated by persons skilled in the art that the present invention is not limited by what has been particularly shown and described herein above. Rather the scope of the invention is defined by the claims which follow.

We claim:

1. A system for controlling a group of photovoltaic energy generators, the system comprising a power feedback circuit configured to provide, to a junction that is coupled to a component of a first photovoltaic energy generator (PEG), power generated by multiple PEGs of the group of photovoltaic energy generators (PRGs) such as to increase the power generated from the PEGs; wherein the group of PEGs comprises the first PEG and a second PEG; wherein each PEG of the group of PEGS comprises a photovoltaic cell.

2. The system according to claim 1 wherein the first PEG contributes to the production of power of the group of PEGs.

3. The system according to claim 1 wherein the first PEG generates less current then another PEG that is serially coupled to the first PEG and belongs to the group of PEGs.

4. The system according to claim 3 wherein the power feedback circuit provides current to the conductive element that is coupled to the first PEG such as to at least partially compensate for a difference between the current generated by the first PEG and a current generated by the other PEG.

5. The system according to claim 1 wherein the first PEG generates less voltage then another PEG that is coupled in parallel to the first PEG and belongs to the group of PEGs.

6. The system according to claim 1 further comprising a power or voltage or current sensor configured to sense power or voltage or current generated by the group of PEGs.

7. The system according to claim 6 wherein the power or voltage or current sensor also senses power or voltage or current generated by the first PEG.

8. The system according to claim 1 further comprising a controller adapted to determine whether to provide the power in response to power considerations.

9. The system according to claim 1 wherein the provision of power determines a working point of the first PEG.

10. The system according to claim 1 wherein the power feedback circuit provides a power of a first value to the first PEG; a power or voltage or current sensor of the system that measures the power or voltage or current generated by the group of PEGs to provide a first measurement result; the power feedback circuit provides a power of a second value to the first PEG; the power sensor measures the power generated by the group of PEGs to provide a second measurement result; and wherein a controller of the system determines a value of power to be provided to the first PEG in response to a comparison between the first and second measurement results.

11. The system according to claim 1 wherein the power feedback circuit is a direct current (DC) to DC converter adapted to provide to the first PEG a first current and a first voltage.

12. The system according to claim 11 wherein the DC to DC converter is responsive to a number of PEGs in the group of PEGs and to a desired power correction parameter.

13. The system according to claim 1 wherein a controller of the system is configured to determine a value of power to be provided to the first PEG.

14. The system according to claim 1 wherein a controller of the system is configured to determine a value of power to be provided to the first PEG in a periodic manner.

15. The system according to claim 1 wherein a controller of the system is configured to determine a value of power to be provided to the first PEG in response to an event.

16. The system according to claim 1 wherein a controller of the system is configured to determine a value of power to be provided to the first PEG in response to an expected illumination condition change.

17. The system according to claim 1 wherein a controller of the system is configured to determine a value of power to be provided to the first PEG in response to reduction in the power generated by the group of PEGs.

18. The system according to claim 1 wherein a controller of the system is configured to select the first and second PEGs in response to an illumination condition; wherein the multiple PEGs comprise the second PEG.

19. The system according to claim 1 wherein the first PEG is a single) photovoltaic cell.

20. The system according to claim 1 wherein the first PEG comprises multiple photovoltaic cells.

21. The system according to claim 1 wherein the first PEG is a photovoltaic cell panel.

22. The system according to claim 1 comprising at least one power feedback circuit that provides power to each conducting element out of multiple conducting elements that are coupled to the multiple PEGs of the group of PEGs.

23. The system according to claim 1 comprising a second power feedback circuit that provides, to a junction that is coupled to a component of a third PEG, power generated by at least a fourth PEG such as to increase the power generated from the group of PEGs; wherein the group of PEGs comprises the third PEG and the fourth PEG.

24. The system according to claim 1 comprises a bypass element that selectively bypasses a PEG of the group of PEGs.

25. The system according to claim 1 comprising comprises a bypass element that) selectively bypasses a PEG of the group of PEGs if a power generated by the PEG is below a power threshold.

26. The system according to claim 1 comprising the group of PEGs.

27. The system according to claim 1 comprising the first PEG.

28. The system according to claim 1 comprising the second PEG.

29. A system for controlling a group of photovoltaic energy generators, the system comprising a power feedback circuit that provides, to a junction that is coupled to a component of a first photovoltaic energy generator (PEG), power generated by multiple photovoltaic energy generators PEGs such as to alter a working point of the group of photovoltaic energy generators PEGs; wherein the group of PEGs comprises the first PEG and a second PEG; wherein each PEG of the group of PEGS comprises a photovoltaic cell.

30. A system for controlling a group of photovoltaic energy generators, the system comprising a sensor that receives current and voltage from at least a second photovoltaic energy generator (PEG); a controller that determines at least one conversion parameter; a power feedback circuit that performs a voltage and current conversion in response to the at least one conversion parameter to provide a converted current and a converted voltage to a first PEG so that the first PEG contributes to a power production of a group of photovoltaic energy generators (PEGs) and wherein the power generated by the group of PEGs is greater than a power produced by the group of PEGs if the first PEG is bypassed or isolated from other PEGs of the group of PEGs; wherein the group of PEGs comprises the first PEG and the second PEG; wherein each PEG of the group of PEGS comprises a photovoltaic cell.

31. A method for controlling a group of photovoltaic energy generators, the method comprising:
  receiving, by a sensor, current and voltage from at least a second photovoltaic energy generator (PEG);
  determining, by a controller, at least one conversion parameter;
  performing, by a power feedback circuit, a voltage and current conversion in response to the at least one conversion parameter to provide a converted current and a converted voltage to a first PEG so that the first PEG contributes to a power production of a group of photovoltaic energy generators (PEGs) and wherein the power generated by the group of PEGs is greater than a power produced by the group of PEGs if the first PEG is bypassed or isolated from other PEGs of the group of PEGs; wherein the group of PEGs comprises the first PEG and the second PEG; wherein each PEG of the group of PEGS comprises a photovoltaic cell.

* * * * *